(12) United States Patent
Liu et al.

(10) Patent No.: US 6,207,568 B1
(45) Date of Patent: Mar. 27, 2001

(54) IONIZED METAL PLASMA (IMP) METHOD FOR FORMING (111) ORIENTED ALUMINUM CONTAINING CONDUCTOR LAYER

(75) Inventors: Chung-Shi Liu; Shau-Lin Shue, both of Hsinchu; Chen-Hua Yu, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/200,554

(22) Filed: Nov. 27, 1998

(51) Int. Cl.[7] .................................................. H01L 21/44
(52) U.S. Cl. ......................... 438/688; 438/627; 438/643; 438/648; 438/653; 438/656; 438/685
(58) Field of Search ..................................... 438/688, 622, 438/627, 643, 648, 653, 656, 685

(56) References Cited

U.S. PATENT DOCUMENTS

| | | | |
|---|---|---|---|
| 5,242,860 | 9/1993 | Nulman et al. | 437/190 |
| 5,312,772 | 5/1994 | Yokoyama et al. | 437/190 |
| 5,356,836 * | 10/1994 | Chen et al. | 438/627 |
| 5,449,641 | 9/1995 | Maeda | 437/195 |
| 5,581,125 | 12/1996 | Maeda | 257/767 |
| 5,604,155 | 2/1997 | Wang | 437/190 |
| 5,665,640 | 9/1997 | Foster et al. | 438/680 |
| 5,882,399 * | 3/1999 | Ngan et al. | 117/89 |
| 5,925,225 * | 7/1999 | Ngan et al. | 204/192.17 |
| 5,989,623 * | 11/1999 | Chen et al. | 427/97 |

* cited by examiner

Primary Examiner—Charles Bowers
Assistant Examiner—Thanh Nguyen
(74) Attorney, Agent, or Firm—George O. Saile; Stephen B. Ackerman; Stephen G. Stanton

(57) ABSTRACT

A method for forming an aluminum containing conductor layer. There is first provided a substrate. There is then formed over the substrate a titanium layer employing an ionized metal plasma bias sputtering method. Finally there is then formed upon the titanium layer an aluminum containing conductor layer. By employing the ionized metal plasma bias sputtering method for forming the titanium layer, the aluminum containing conductor layer is formed with an enhanced (111) crystallographic orientation. The method is particularly useful for forming aluminum containing conductor layers with enhanced electromigration resistance, even under circumstances where there is formed interposed between a titanium layer and an aluminum containing conductor layer a titanium nitride layer.

28 Claims, 1 Drawing Sheet

IONIZED METAL PLASMA (IMP) METHOD FOR FORMING (111) ORIENTED ALUMINUM CONTAINING CONDUCTOR LAYER

BACKGROUND OF THE INVENTION

1. Field of the Invention

The present invention relates generally to methods for forming conductor layers within microelectronics fabrications. More particularly, the present invention relates to methods for forming electromigration resistant aluminum containing conductor layers within microelectronics fabrications.

2. Description of the Related Art

Microelectronics fabrications are formed from microelectronics substrates over which are formed patterned microelectronics conductor layers which are separated by microelectronics dielectric layers.

As microelectronics fabrication integration levels have increased, and patterned microelectronics fabrication conductor layer dimensions have decreased, it has become common for microelectronics fabrications which employ patterned aluminum containing microelectronics conductor layers to experience electromigration effects when the patterned aluminum containing microelectronics conductor layers are employed for carrying comparatively high electrical current densities of greater than about 2E5 amps per square centimeter. Electromigration effects are undesirable within advanced microelectronics fabrications since electromigration effects provide microelectronics fabrications with compromised functionality or reliability.

It is thus towards the goal of forming within advanced microelectronics fabrications patterned aluminum containing microelectronics conductor layers with enhanced electromigration resistance that the present invention is directed.

Various methods have been disclosed in the art of microelectronics fabrication for forming within microelectronics fabrications aluminum containing conductor layers, as well as other types of conductor layers, within desirable properties within microelectronics fabrications.

For example, Nulman et al., in U.S. Pat. No. 5,242,860, discloses a method for forming upon a silicon substrate employed within an integrated circuit microelectronics fabrication a titanium nitride layer with a (111) crystallographic orientation such that there may be formed upon the (111) titanium nitride layer a (111) aluminum containing conductor layer with inherently enhanced electromigration resistance. The method employs a titanium nitride layer of indeterminate crystallographic orientation formed interposed between a pair of titanium layers formed upon the silicon substrate to form a tri-layer stack, such that upon a thermal annealing of the tri-layer stack within a nitrogen containing atmosphere absent oxygen there is formed from the upper lying titanium layer a titanium nitride layer at least the surface of which has the (111) crystallographic orientation.

In addition, Yokoyama et al., in U.S. Pat. No. 5,312,772, discloses a method for forming within a semiconductor integrated circuit microelectronics fabrication, with improved bondability, step coverage, reliability and attenuated spiking into a silicon semiconductor substrate an aluminum containing conductor layer contacting the silicon semiconductor substrate at the location of a via through a dielectric layer, which via accesses the silicon semiconductor substrate. The method employs a bilayer underlayer upon which is formed the aluminum containing conductor layer, where the bilayer underlayer comprises a metal silicide forming metal layer having a metal nitride layer formed thereupon, the bilayer underlayer being formed upon both the dielectric layer and the silicon semiconductor substrate at the location of the via, where upon thermal annealing in a nitrogen atmosphere with a trace impurity of oxygen the bilayer underlayer the metal silicide forming metal layer forms a metal silicide layer at the location of the silicon substrate, but not at the location of the dielectric layer, and the metal nitride is oxidized to form a metal oxynitride surface layer.

Further, Maeda, in U.S. Pat. No. 5,449,641 and U.S. Pat. No. 5,581,125 discloses a method for forming an interconnect layer, and the interconnect layer formed employing the method, where the interconnect layer is formed of an aluminum containing conductor layer having a (111) crystallographic orientation. The method employs a titanium oxynitride barrier layer having a (111) crystallographic orientation, in conjunction with a high temperature sputtering of the aluminum containing conductor layer such that the (111) crystallographic orientation of the barrier layer is replicated within the aluminum containing conductor layer.

Still further, Wang, in U.S. Pat. No. 5,604,155, discloses a method for forming a silicon doped aluminum containing conductor contact layer with attenuated silicon nodule formation when forming the silicon doped aluminum containing conductor layer upon a barrier layer while employing a thermal sputtering method. The method employs a titanium adhesion promoter layer interposed between the silicon doped aluminum containing conductor layer and the barrier layer such that an aluminum titanate layer is formed which absorbs the silicon nodules which otherwise form when cooling the silicon doped aluminum containing conductor contact formed while employing the thermal sputtering method.

Finally, Foster et al., in U.S. Pat. No. 5,665,640, discloses a plasma enhanced chemical vapor deposition (PECVD) method for forming within a semiconductor integrated circuit microelectronics fabrication a titanium containing layer. The plasma enhanced chemical vapor deposition (PECVD) method employs a downstream flow of plasma induced radicals, such as formed employing a plasma activation of hydrogen, nitrogen or ammonia, admixed with a flow of a titanium tetrahalide in the vicinity of the substrate. The plasma enhanced chemical vapor deposition method may also employ a radio frequency biasing of a showerhead nozzle employed within an apparatus employed within the method.

Desirable within the art of microelectronics fabrication are additional methods and materials which may be employed for forming aluminum containing conductor layers with enhanced electromigration resistance within microelectronics fabrications.

It is towards that goal that the present invention is directed.

SUMMARY OF THE INVENTION

A first object of the present invention is to provide a method for forming an aluminum containing conductor layer within a microelectronics fabrication.

A second object of the present invention is to provide a method in accord with the first object of the present invention, where the aluminum containing conductor layer is formed with enhanced electromigration resistance.

A third object of the present invention is to provide a method in accord with the first object of the present invention or the second object of the present invention, which method is readily commercially implemented.

In accord with the objects of the present invention, there is provided a method for forming an aluminum containing conductor layer. To practice the method of the present invention, there is first provided a substrate. There is then formed over the substrate a titanium layer employing an ionized metal plasma bias sputtering method. There is then formed upon the titanium layer an aluminum containing conductor layer, wherein by employing the ionized metal plasma bias sputtering method for forming the titanium layer the aluminum containing conductor layer is formed with an enhanced (111) crystallographic orientation.

The present invention provides a method for forming an aluminum containing conductor layer within a microelectronics fabrication, where the aluminum containing conductor layer is formed with enhanced electromigration resistance. The method of the present invention realizes the foregoing objects by employing as an underlayer when forming the aluminum containing conductor layer a titanium layer formed employing an ionized metal plasma bias sputtering method to form the aluminum containing conductor layer with an enhanced (111) crystallographic orientation. The enhanced (111) crystallographic orientation provides enhanced electromigration resistance to the aluminum containing conductor layer.

The method of the present invention is readily commercially implemented. The method of the present invention employs plasma activation methods as are generally known in the art of microelectronics fabrication, although not necessarily directed towards the object of the present invention. Since it is a novel ordering and use of methods and materials which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiments, which follows. The Description of the Preferred Embodiments is understood within the context of the accompanying drawings, which form a material part of this disclosure, wherein.

DESCRIPTION OF THE PREFERRED EMBODIMENTS

The present invention provides a method for forming within a microelectronics fabrication an aluminum containing conductor layer with enhanced electromigration resistance. The method of the present invention realizes the foregoing object by employing when forming the aluminum containing conductor layer an underlayer formed of a titanium layer formed employing an ionized metal plasma bias sputtering method.

The method of the present invention may be employed in forming electromigration resistant aluminum containing conductor layers within microelectronics fabrications including but not limited to semiconductor integrated circuit microelectronics fabrications, solar cell microelectronics fabrications, ceramic substrate microelectronics fabrications and flat panel display microelectronics fabrications.

First Preferred Embodiment

Figure 1:
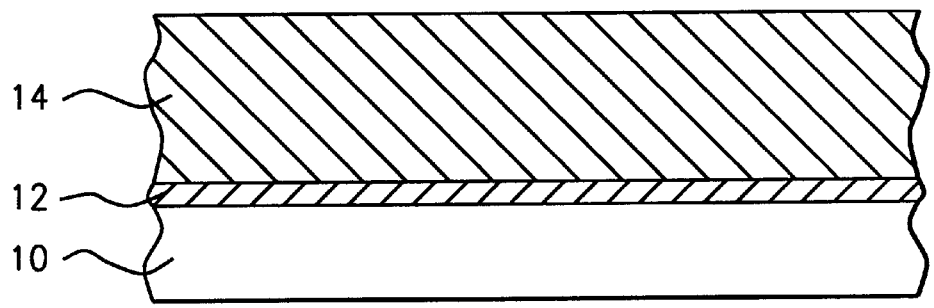
FIG. 1 shows a schematic cross-sectional diagram illustrating a microelectronics structure formed in accord with a general embodiment of the present invention which comprises a first preferred embodiment of the present invention.

Referring now to FIG. 1, there is shown a schematic cross-sectional diagram illustrating a microelectronics fabrication structure formed in accord with a general embodiment of the present invention which comprises a first preferred embodiment of the present invention.

Shown in FIG. 1 is a substrate 10 employed within a microelectronics fabrication, where the microelectronics fabrication may be selected from the group including but not limited to semiconductor integrated circuit microelectronics fabrications, solar cell microelectronics fabrications, ceramic substrate microelectronics fabrications and flat panel display microelectronics fabrications. In particular, within the first preferred embodiment of the present invention when the substrate 10 is a semiconductor substrate employed within a semiconductor integrated circuit microelectronics fabrication, the semiconductor substrate typically and preferably has formed therein and/or thereupon semiconductor integrated circuit devices as are common within semiconductor integrated circuit microelectronics fabrications. Such semiconductor integrated circuit devices may include, but are not limited to, transistors, resistors, diodes and capacitors.

Similarly, although also not specifically illustrated within the schematic cross-sectional diagram of FIG. 1, the substrate 10 may be the substrate alone employed within the microelectronics fabrication, or in the alternative, the substrate 10 may be the substrate employed within the microelectronics fabrication, where the substrate has formed thereupon and/or thereover any of several additional layers as are commonly employed when forming the microelectronics fabrication. Such additional layers may include, but are not limited to microelectronics conductor layers, microelectronics semiconductor layers and microelectronics dielectric layers.

Shown also within FIG. 1 formed upon the substrate 10 is a blanket titanium layer 12. Within the first preferred embodiment of the method of the present invention, the blanket titanium layer 12 is formed employing an ionized metal plasma bias sputtering method. Such a method correlates with, but is nonetheless distinguished from, a conventional bias sputtering method by employing in conjunction with an argon sputtering gas for bias sputtering a titanium target with respect to the substrate 10 when forming the blanket titanium layer 12 a simultaneous radio frequency plasma activation of bias sputtered titanium materials formed within a bias sputtering reactor chamber when forming the blanket titanium layer 12. Although other methods may be employed, the radio frequency plasma activation of the bias sputtered titanium materials formed within the bias sputtering reactor chamber is typically effected by fabricating a radio frequency coil surrounding the bias sputtering reactor chamber. Upon impressing a radio frequency power (via an electrical current) upon the radio frequency coil, the radio frequency power is inductively coupled to the bias sputtering reactor chamber such that a magnetic field induced by the electrical current within the radio frequency coil further induces currents within a plasma formed within the bias sputtering reactor chamber. Thus, energy supplied to the radio frequency coil by a radio frequency generator is thus transferred to the plasma within the bias sputtering reactor chamber. Similarly, since titanium has a lower ionization energy than argon, there is then formed within the bias sputtering reactor chamber, upon plasma activation and reaction with appropriate species formed within the plasma, substantial quantities of ionized titanium metal species which are deposited when forming the blanket titanium layer 12.

Preferably, the ionized metal plasma bias sputtering method also employs, when processing an eight inch diameter substrate 10: (1) a reactor chamber pressure of from about 10 to about 30 mtorr; (2) a radio frequency induced plasma source power of from about 1000 to about 3000 watts at a radio frequency of 13.56 MHZ; (3) a DC bias sputtering power of from about 1000 to about 3000 watts; (4) a substrate 10 temperature of from about 100 to about 300 degrees centigrade; (5) an argon sputtering gas flow rate of from about 30 to about 100 standard cubic centimeters per minute (sccm); and (6) a titanium target to substrate 10 spacing of from about 125 to about 140 millimeters (mm). Preferably, the blanket titanium layer 12 is formed to a thickness of at least about 50 angstroms. More preferably, the blanket titanium layer 12 is formed to a thickness greater than about 100 angstroms. Most preferably, the blanket titanium layer 12 is formed to a thickness of from about 80 to about 200 angstroms.

Finally, there is shown within FIG. 1 a blanket aluminum containing conductor layer 14 formed upon the blanket titanium layer 12. Within the first preferred embodiment of the present invention, the blanket aluminum containing conductor layer 14 is formed from any aluminum containing conductor material which may conventionally be employed within the art of microelectronics fabrication. Such aluminum containing conductor materials will typically and preferably include aluminum, as well as aluminum alloys such as but not limited to aluminum-copper alloys, aluminum-silicon alloys, and aluminum-silicon-copper alloys, typically and preferably having weight percent aluminum of greater than about 95 percent.

Although the blanket aluminum containing conductor layer 14 may be formed employing any of several methods as are known in the art of microelectronics fabrication, including but not limited to thermally assisted evaporation methods, electron beam assisted evaporation methods and physical vapor deposition (PVD) sputtering methods, for the first preferred embodiment of the present invention, the blanket aluminum containing conductor layer 14 is preferably formed employing a physical vapor deposition (PVD) sputtering method, preferably a bias sputtering method, as is conventional in the art of microelectronics fabrication. Preferably, the blanket aluminum containing conductor layer 14 is formed to a thickness of from about 3000 to about 9000 angstroms.

Although not specifically illustrated within the schematic cross-sectional diagram of FIG. 1, the blanket titanium layer 12 and the blanket aluminum containing conductor layer 14 are preferably formed sequentially in-situ within a single physical vapor deposition (PVD) bias sputtering reactor chamber, or within adjoining reactor chambers within a multi-chamber "cluster" physical vapor deposition (PVD) bias sputtering reactor tool, without exposure to atmosphere. Under such circumstances, atmospheric induced defects are attenuated when forming the microelectronics fabrication as illustrated within FIG. 1. Similarly, although also not specifically illustrated within the schematic cross-sectional diagram of FIG. 1, there is no need within the first preferred embodiment of the present invention to employ any annealing of the blanket titanium layer 12 prior to forming the blanket aluminum containing conductor layer 14 thereupon, beyond the annealing inherently induced by employing the substrate 10 temperature of from about 100 to about 300 degrees centigrade when forming the blanket titanium layer 12 when employing the ionized metal plasma bias sputtering deposition method. Similarly, there is also not needed within the first preferred embodiment of the present invention any annealing of the blanket aluminum containing conductor layer 14 beyond the annealing inherently induced by employing the substrate 10 temperature of from about 200 to about 400 degrees centigrade when forming the blanket aluminum containing conductor layer 14 upon the blanket titanium layer 12. Finally, within the first preferred embodiment of the present invention there is also not intentionally employed any nitrogenation or oxidation processing of the blanket titanium layer 12 prior to forming the blanket aluminum containing conductor layer 14 thereupon.

Upon forming the microelectronics fabrication whose schematic cross-sectional diagram is illustrated in FIG. 1, there is formed a microelectronics fabrication having formed therein a blanket aluminum containing conductor layer having enhanced electromigration resistance since the blanket aluminum containing conductor layer is formed with an enhanced (111) crystallographic orientation by forming the blanket aluminum containing conductor layer upon a blanket titanium layer formed employing an ionized metal plasma bias sputtering method.

Second Preferred Embodiment

Figure 2:
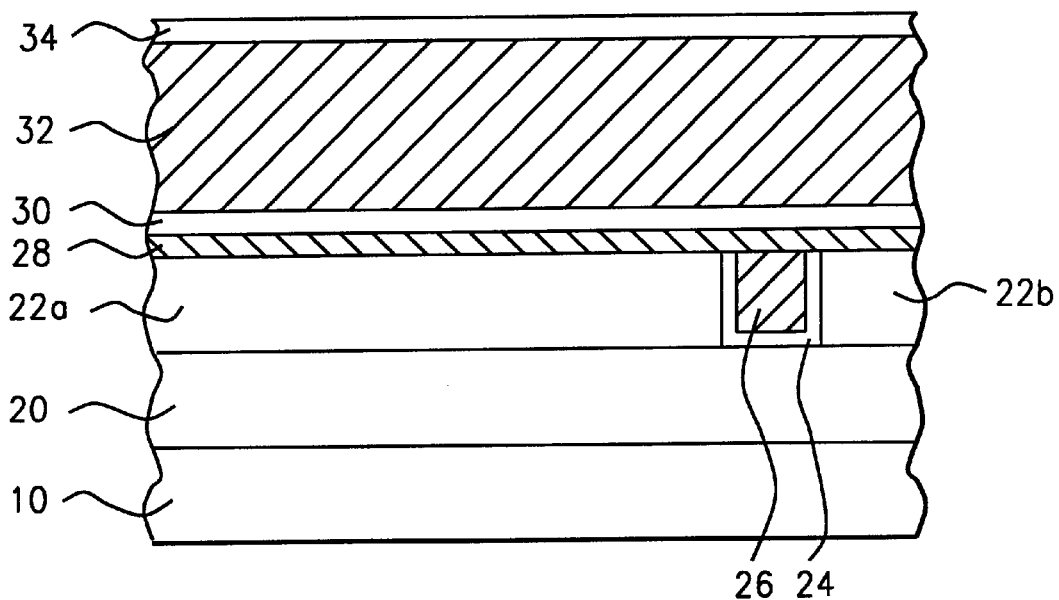
FIG. 2 shown a schematic cross-sectional diagram illustrating a microelectronics structure formed in accord with a more specific embodiment of the present invention which comprises a second preferred embodiment of the present invention.

Referring now to FIG. 2, there is shown a schematic cross-sectional diagram illustrating a microelectronics fabrication formed in accord with a more specific embodiment of the present invention which comprises a second preferred embodiment of the present invention.

Shown in FIG. 2 is a substrate 10 which is otherwise analogous or equivalent to the substrate 10 employed within the first preferred embodiment of the present invention within the microelectronics fabrication whose schematic cross-sectional diagram is illustrated in FIG. 1.

Shown also within FIG. 2 formed upon the substrate 10 is a blanket first conductor layer 20 which may be formed from any of several conductor materials as are common in the art of microelectronics fabrication, including but not limited to highly doped (i.e. from about 5E18 to about 5E20 dopant atoms per cubic centimeter) polysilicon conductor materials, polycide (i.e. highly doped polysilicon/metal silicide stack) conductor materials, metal conductor materials and metal alloy conductor materials. Within the second preferred embodiment of the present invention, the blanket first conductor layer 20 may also comprise a blanket titanium layer having formed thereupon a blanket aluminum containing conductor layer in accord with the blanket titanium layer 12 having formed thereupon the blanket aluminum containing conductor layer 14 employed within the first preferred embodiment of the present invention as illustrated within the schematic cross-sectional diagram of FIG. 1. Preferably the blanket first conductor layer 20 is formed to a thickness of from about 3000 to about 9000 angstroms.

Shown also within FIG. 2 formed upon the blanket first conductor layer 20 is a pair of patterned dielectric layers 22a and 22b which define a via accessing the blanket first conductor layer 20. Although the patterned dielectric layers 22a and 22b may be formed employing any of several methods as are common in the art of microelectronics fabrication, including but not limited to chemical vapor deposition (CVD) methods, plasma enhanced chemical vapor deposition (PECVD) methods and physical vapor deposition (PVD) sputtering methods which may be employed to form the patterned dielectric layers 22a and 22b of dielectric materials including but not limited to silicon oxide dielectric materials, silicon nitride dielectric materials and silicon oxynitride dielectric materials, for the second preferred embodiment of the present invention, the patterned dielectric layers 22a and 22b are preferably formed of a silicon oxide dielectric material deposited employing a plasma enhanced chemical vapor deposition (PECVD) method. Preferably, the patterned dielectric layers 22a and 22b are each formed to a thickness of from about 6000 to about 10000 angstroms.

There is also shown within FIG. 2 formed into the via defined by the pair of patterned dielectric layers 22a and 22b a patterned planarized conformal first barrier layer 24 having formed thereupon a patterned planarized conductor stud layer 26. Within the second preferred embodiment of the present invention, the patterned planarized conformal first barrier layer 24 may be formed employing methods and materials as are conventional in the art of microelectronics fabrication, including but not limited to chemical vapor deposition (CVD) methods, plasma enhanced chemical vapor deposition (PECVD) methods and physical vapor deposition (PVD) sputtering methods, along with reactive ion etch (RIE) etchback planarizing methods and chemical mechanical polish (CMP) planarizing methods, through which may be formed patterned planarized conformal barrier layers of barrier materials including but not limited to titanium nitride barrier materials, titanium tungsten alloy barrier materials and tungsten nitride barrier materials. Preferably the patterned planarized conformal first barrier layer 24 is: (1) formed as a blanket conformal barrier layer upon the patterned dielectric layers 22a and 22b and into the via and contacting the conductor layer 20 employing a titanium nitride barrier material formed to a thickness of from 50 to about 1000 angstroms employing a chemical vapor deposition (CVD) or physical vapor deposition (PVD) sputtering method; and (2) subsequently planarized employing a chemical mechanical polish (CMP) planarizing method.

Similarly, the patterned planarized conductor stud layer 26 may be formed employing methods and materials as are similarly conventional in the art of microelectronics fabrication, including but not limited to chemical vapor deposition (CVD) methods, plasma enhanced chemical vapor deposition (PECVD) methods and physical vapor deposition (PVD) sputtering methods, in conjunction with reactive ion etch (RIE) etchback planarizing methods and chemical mechanical polish (CMP) planarizing methods, through which may be formed patterned planarized conductor stud layers of conductor materials including but not limited to highly doped polysilicon, polycide, metal and metal alloy conductor stud materials. For the second preferred embodiment of the present invention, the patterned planarized conductor stud layer 26 is preferably formed of a tungsten containing material formed employing a chemical vapor deposition (CVD) method and subsequently chemical mechanical polish (CMP) planarized to form the patterned planarized conductor stud layer 26. Preferably, the patterned planarized conductor stud layer 26 is formed to a thickness which completely fills the via defined by the patterned dielectric layers 22a and 22b.

Shown also in FIG. 2 is a blanket titanium layer 28 formed upon the exposed portions of the patterned dielectric layers 22a and 22b, the patterned planarized conformal first barrier layer 24 and the patterned planarized conductor stud layer 26. Within the second preferred embodiment of the present invention, the blanket titanium layer 28 is formed employing methods, materials and thickness dimensions analogous or equivalent to the methods, materials and thickness dimensions employed in forming the blanket titanium layer 12 within the first preferred embodiment of the present invention as illustrated within the schematic cross-sectional diagram of FIG. 1. Thus, the blanket titanium layer 28 is formed employing an ionized metal plasma bias sputtering method.

Shown also within FIG. 2 formed upon the blanket titanium layer 28 is a blanket second barrier layer 30. Similarly with the patterned planarized conformal first barrier layer 24, the blanket second barrier layer 30 is also preferably formed of a titanium nitride barrier material, preferably deposited employing a physical vapor deposition (PVD) sputtering method, as is conventional in the art of microelectronics fabrication. Other barrier materials as are known in the art of microelectronics fabrication are not precluded for forming the blanket second barrier layer 30, provided they efficiently replicate a crystallographic orientation structure formed within the blanket titanium layer 12 and thus efficiently induce a (111) crystallographic orientation within a blanket aluminum containing conductor layer formed upon the blanket second barrier layer 30. Preferably, the blanket second barrier layer 30 is formed to a thickness of from about 200 to about 500 angstroms.

Preferably, the physical vapor deposition (PVD) sputtering method for forming the blanket second barrier layer 30 when formed of titanium nitride upon an eight inch diameter substrate 10 employs: (1) a reactor chamber pressure of from about 2 to about 10 mtorr; (2) a bias sputtering power of from about 2000 to about 10000 watts without any plasma activation; (3) a substrate 10 temperature of from about 20 to about 200 degrees centigrade; (4) an argon sputtering gas flow rate of from about 20 to about 80 standard cubic centimeters per minute (sccm); and (5) a titanium nitride target to substrate 10 spacing of from about 40 to about 60 millimeters (mm).

Shown also within FIG. 2 is a blanket aluminum containing conductor layer 32 formed upon the blanket barrier layer 30. Within the second preferred embodiment of the present invention, the blanket aluminum containing conductor layer 32 is preferably formed employing methods, materials and thickness dimensions analogous or equivalent to the methods, materials and thickness dimensions employed for forming the blanket aluminum containing conductor layer 14 within the first preferred embodiment of the present invention as illustrated within the schematic cross-sectional diagram of FIG. 1.

When employing a bias sputtering method for forming the blanket aluminum containing conductor layer 32 upon the blanket second barrier layer 30 upon an eight inch diameter substrate 10 within the second preferred embodiment of the present invention, there is employed: (1) a reactor chamber pressure of from about 3 to about 8 mtorr; (2) a bias sputtering power of from about 4000 to about 12000 watts without any plasma activation; (3) a substrate 10 temperature of from about 200 to about 400 degrees centigrade; (4) an argon sputtering gas flow rate of from about 40 to about 100 standard cubic centimeters per minute (sccm); and (5) an aluminum-copper target to substrate 10 spacing of from about 40 to about 60 millimeters (mm).

Finally, there is shown within FIG. 2 the presence of a blanket third barrier layer 34 formed upon the blanket aluminum containing conductor layer 32. Within the second preferred embodiment of the present invention, the blanket third barrier layer 34 is preferably formed employing methods, materials and thickness dimensions analogous or equivalent to the methods, materials and thickness dimensions employed for forming the blanket second barrier layer 30.

Although not specifically illustrated within the schematic cross-sectional diagram of FIG. 2, it is preferred within the second preferred embodiment of the present invention that the blanket titanium layer 28, the blanket second barrier layer 30, the blanket aluminum containing conductor layer 32 and the blanket second barrier layer 34 be formed sequentially in-situ within a single reactor chamber or within adjoining reactor chambers within a physical vapor deposition (PVD) bias sputtering "cluster" tool. Similarly, it is also preferred within the second preferred embodiment of the present invention that neither the blanket titanium layer 28, the blanket second barrier layer 30 nor the blanket aluminum containing conductor layer 32 is thermally annealed, nitrided nor oxidized prior to forming thereupon a subsequent layer within the microelectronics fabrication whose schematic cross-sectional diagram is illustrated within FIG. 2.

As is understood by a person skilled in the art, a multi-layer blanket layer stack formed within the microelectronics fabrication whose schematic cross-sectional diagram is illustrated in FIG. 2, comprising the blanket titanium layer 28, the blanket second barrier layer 30, the blanket aluminum containing conductor layer 32 and the blanket third barrier layer 34 may subsequently be patterned to form a patterned multi-layer stack while employing photolithographic and etch methods as are conventional in the art of microelectronics fabrication.

Upon forming the microelectronics fabrication whose schematic cross-sectional diagram is illustrated in FIG. 2, there is formed a microelectronics fabrication having formed therein a blanket aluminum containing conductor layer separated from a blanket titanium layer by a blanket barrier layer, where even in the absence of any annealing of the blanket titanium layer, the blanket aluminum containing conductor layer and the blanket barrier layer the blanket aluminum containing conductor layer is formed with enhanced electromigration resistance since the blanket aluminum containing conductor layer is formed with an enhanced (111) crystallographic orientation. The enhanced (111) crystallographic orientation of the blanket aluminum containing conductor layer is realized, even with the presence of the blanket barrier layer formed thereunder, due to employing when forming the blanket titanium layer an ionized metal plasma bias sputtering method.

EXAMPLES

There was obtained a group of eight (100) silicon semiconductor substrates and formed upon each silicon semiconductor substrate within the group of eight (100) silicon semiconductor substrates a blanket dielectric layer formed of a silicon oxide dielectric material. The blanket dielectric layers were formed employing a plasma enhanced chemical vapor deposition (PECVD) method, in turn employing tetraethylorthosilicate (TEOS) as a silicon source material as nitrous oxide as an oxidant source material, as is conventional in the art of microelectronics fabrication. Each of the blanket dielectric layers was formed to a thickness of about 8000 angstroms.

Upon each of the eight blanket dielectric layers was then formed a blanket titanium layer employing one of three methods to a thickness of either 100 angstroms or 200 angstroms as noted within Table I.

The first method for forming the blanket titanium layer was an ionized metal plasma bias sputtering method in accord with the preferred embodiments of the present invention. The ionized metal plasma bias sputtering method employed: (1) a reactor chamber pressure of about 23 mtorr; (2) a radio frequency induced plasma source power of about 2500 watts at a source radio frequency of 13.56 MHZ; (3) a bias sputtering power of about 2000 watts; (4) a substrate temperature of about 200 degrees centigrade; (5) an argon sputtering gas flow rate of about 50 standard cubic centimeters per minute (sccm); and (6) a titanium target to semiconductor substrate spacing of about 130 millimeters (mm).

The second method for forming the blanket titanium layer was a collimated bias sputter deposition method which was similar to the ionized metal plasma bias sputtering method but wherein: (1) there was not employed a radio frequency plasma activation within the bias sputtering method; and (2) there was employed a collimation grid interposed between the titanium target and the semiconductor substrate. The collimated bias sputter deposition method also employed: (1) a reactor chamber pressure of about 1 mtorr; (2) a bias sputtering power of about 12000 watts without plasma activation; (3) a semiconductor substrate temperature of about 100 degrees centigrade; (4) an argon flow rate of about 50 standard cubic centimeters per minute (sccm); and (5) a titanium target to collimation grid spacing of about 30 millimeters (mm) and a collimation grid to semiconductor substrate spacing of about 30 millimeters (mm).

The third method for forming the blanket titanium layer employed a bias sputter deposition method otherwise equivalent with the collimated bias sputtering method, but absent the collimation grid.

Upon each of three blanket titanium layers formed to a thickness of about 100 angstroms employing each of the three blanket titanium layer deposition methods was formed a blanket titanium nitride barrier layer to a thickness of about 250 angstroms while employing a conventional bias sputtering method in accord with the preferred embodiments of the present invention. The conventional bias sputtering method also employed: (1) a reactor chamber pressure of about 5 mtorr; (2) a bias sputtering power of about 2000 watts, without plasma activation; (3) a semiconductor substrate temperature of about 100 degrees centigrade; (4) an argon sputtering gas flow rate of about 50 standard cubic centimeters per minute (sccm); and (5) a titanium nitride target to semiconductor substrate spacing of about 60 millimeters (mm).

There was then formed upon each of the eight semiconductor substrates upon either the five remaining blanket titanium layers or the three blanket titanium nitride layers a blanket aluminum containing conductor layer formed employing a conventional bias sputtering method in accord with the preferred embodiments of the present invention. Each aluminum containing conductor layer was formed to a thickness of about 4000 angstroms while employing an aluminum-copper alloy of weight ratio about 99.0:1.0. The bias sputtering method also employed: (1) a reactor chamber pressure of about 5 mtorr; (2) a bias sputtering power of about 12000 watts, without plasma activation; (3) a semiconductor substrate temperature of about 300 degrees centigrade; (4) an argon sputtering gas flow rate of about 75 standard cubic centimeters per minute (sccm); and (5) an aluminum-copper target to semiconductor substrate spacing of about 50 millimeters (mm).

There was then measured the crystallographic orientation of the aluminum containing conductor layers formed upon each of the eight semiconductor substrates while employing an x-ray spectroscopic method as is conventional in the art of microelectronics fabrication. The intensity of the (111) aluminum-copper peaks (at 2Θ equal about 38.6 degrees) within each of the x-ray diffraction spectra are reported in Table I, as a function of titanium layer deposition method, titanium layer thickness and the presence or absence of a blanket titanium nitride layer interposed between the blanket titanium layer and the blanket aluminum-copper layer. For comparison purposes, there was also formed upon a ninth semiconductor substrate a titanium nitride layer upon an aluminum-copper layer, where there was not formed beneath the titanium nitride layer a titanium layer.

TABLE I

| Expl. | Titanium Dep. Method | Ti Thickness | TiN Barrier | Al/Cu (111) Peak (counts/second) |
|---|---|---|---|---|
| 1 | Ionized metal plasma | 100 | no | 48K |
| 2 | Collimated bias sputter | 100 | no | 58K |
| 3 | Conventional bias sputter | 100 | no | 52K |
| 4 | Ionized metal plasma | 200 | no | 107K |
| 5 | Collimated bias sputter | 200 | no | 53K |
| 6 | Ionized metal plasma | 100 | yes | 82K |
| 7 | Collimated bias sputter | 100 | yes | 5K |
| 8 | Conventional bias sputter | 100 | yes | 21K |
| 9 | No titanium layer | | yes | 5K |

As is seen from review of the (111) aluminum-copper x-ray diffraction peak intensity data of Table I, the ionized metal plasma bias sputtering deposition method of the present invention performs approximately equivalently with a collimated bias sputtering deposition method and a conventional bias sputtering deposition method when employed for forming a titanium layer as an underlayer at a thickness of about 100 angstroms when forming an num containing conductor layer thereupon with enhanced electromigration resistance. In comparison, and unexpectedly, at a titanium underlayer thickness of 200 angstroms, there is observed a significant advantage of the ionized metal plasma bias sputtering deposition method of the present invention when forming thereover an aluminum containing conductor layer with enhanced electromigration resistance, in comparison with competing collimated and conventional bias sputtering deposition methods. Similarly, the ionized metal plasma bias sputtering deposition method of the present invention provides a titanium underlayer upon which there may be formed an aluminum containing conductor layer with enhanced electromigration resistance even when there is formed a titanium nitride barrier layer interposed between the titanium layer formed employing the ionized metal plasma bias sputtering deposition method and the aluminum containing conductor layer.

As is understood by a person skilled in the art, the preferred embodiments and examples of the present invention are illustrative of the present invention rather than limiting of the present invention. Revisions and modifications may be make to materials, structures and dimensions which may be employed to form microelectronics fabrications in accord with the preferred embodiments and examples of the present invention while still providing microelectronics fabrications formed in accord with the present invention, as defined by the accompanying claims.

What is claimed is:

1. A method for forming an aluminum containing conductor layer comprising:
   providing a substrate;
   forming over the substrate a titanium layer having a thickness of from about 80 to 200 Å and employing an ionized metal plasma bias sputtering method; the ionized metal plasma bias sputtering method employing:
   a reactor chamber pressure of from about 10 to about 30 mTorr;
   a radio frequency induced plasma source power of from about 1000 to about 3000 watts at a radio frequency of 13.56 MHz;
   a DC bias sputtering power of from about 1000 to about 3000 watts;
   a substrate temperature of from about 100 to about 300 degrees centigrade;
   an argon sputtering gas flow rate of from about 30 to about 100 sccm; and
   a titanium target to substrate spacing of from about 125 to about 140 mm; and
   forming upon the titanium layer an aluminum containing conductor layer.

2. The method of claim 1 wherein by employing the ionized metal plasma bias sputtering method for forming the titanium layer the aluminum containing conductor layer is formed with an enhanced (111) crystallographic orientation.

3. The method of claim 1 wherein the substrate is employed within a microelectronics fabrication selected from the group consisting of semiconductor integrated circuit microelectronics fabrications, solar cell microelectronics fabrications, ceramic substrate microelectronics fabrications and flat panel display microelectronics fabrications.

4. The method of claim 1 wherein there is not employed a thermal annealing of the titanium layer after forming the titanium layer and prior to forming the aluminum containing conductor layer upon the titanium layer.

5. The method of claim 1 wherein the titanium layer is formed to a thickness of at least about 80 to about 200 angstroms.

6. The method of claim 1 wherein the ionized metal plasma bias sputtering method employs:
   a radio frequency induced plasma source power of from about 1000 to about 3000 watts; and
   a bias sputtering power of about 1000 to about 3000 watts.

7. The method of claim 1, wherein the titanium layer has a thickness greater than about 100Å.

8. The method of claim 1, wherein the aluminum containing conductor layer has a thickness from about 3000 to 9000 Å, and is formed employing a bias sputtering method.

9. A method for forming an aluminum containing conductor layer comprising:
   providing a substrate; forming over the substrate a titanium layer having a thickness of from about 80 to 200 Å and employing an ionized metal plasma bias sputtering method; the ionized metal plasma bias sputtering method employing:
   a reactor chamber pressure of from about 10 to about 30 mTorr;
   a radio frequency induced plasma source power of from about 1000 to about 3000 watts at a radio frequency of 13.56 MHz;
   a DC bias sputtering power of from about 1000 to about 3000 watts;
   a substrate temperature of from about 100 to about 300 degrees centigrade;
   an argon sputtering gas flow rate of from about 30 to about 100 sccm; and
   a titanium target to substrate spacing of from about 125 to about 140 mm; and
   forming upon the titanium layer a titanium nitride layer;
   forming upon the titanium nitride layer an aluminum containing conductor layer.

10. The method of claim 9, wherein the titanium layer has a thickness greater than about 100Å.

11. The method of claim 9 wherein by employing the ionized metal plasma bias sputtering method for forming the titanium layer the aluminum containing conductor layer is formed with an enhanced (111) crystallographic orientation.

12. The method of claim 9 wherein the substrate is employed within a microelectronics fabrication selected from the group consisting of semiconductor integrated circuit microelectronics fabrications, solar cell microelectronics fabrications, ceramic substrate microelectronics fabrications and flat panel display microelectronics fabrications.

13. The method of claim 9 wherein there is not employed a thermal annealing of the titanium layer after forming the titanium layer and prior to forming the aluminum containing conductor layer upon the titanium layer.

14. The method of claim 9 wherein the titanium layer is formed to a thickness of at least about 80 to about 200 angstroms.

15. The method of claim 9 wherein the ionized metal plasma bias sputtering method employs:
   a radio frequency induced plasma source power of from about 1000 to about 3000 watts; and
   a bias sputtering power of about 1000 to about 3000 watts.

16. The method of claim 9, wherein the titanium nitride layer is formed by a PVD sputtering method.

17. The method of claim 9, wherein the titanium nitride layer has a thickness from about 200 to about 500Å.

18. The method of claim 9, wherein the titanium layer, the titanium nitride layer, and the aluminum containing conductor layer are formed sequentially in-situ within a single reactor chamber.

19. The method of claim 9, wherein the titanium layer, the titanium nitride layer, and the aluminum containing conductor layer are formed sequentially within adjoining reactor chambers within a physical vapor deposition (PVD) bias sputtering Acluster@ tool.

20. A method for forming an aluminum containing conductor layer comprising:
   providing a substrate;
   forming over the substrate a titanium layer employing an ionized metal plasma bias sputtering method employing:
      a reactor chamber pressure of from about 10 to about 30 mTorr;
      a radio frequency induced plasma source power of from about 1000 to about 3000 watts at a radio frequency of 13.56 MHz;
      a DC bias sputtering power of from about 1000 to about 3000 watts;
      a substrate temperature of from about 100 to about 300 degrees centigrade;
      an argon sputtering gas flow rate of from about 30 to about 100 sccm; and
      a titanium target to substrate spacing of from about 125 to about 140 mm; and
   forming upon the titanium layer an aluminum containing conductor layer; said titanium layer having a thickness greater than about 100Å.

21. The method of claim 20, wherein the titanium layer has a thickness from about 80 to 200 Å, and the ionized metal plasma bias sputtering method employs:
   a reactor chamber pressure of from about 10 to about 30 mTorr;
   a radio frequency induced plasma source power of from about 1000 to about 3000 watts at a radio frequency of 13.56 MHz;
   a DC bias sputtering power of from about 1000 to about 3000 watts;
   a substrate temperature of from about 100 to about 300 degrees centigrade;
   an argon sputtering gas flow rate of from about 30 to about 100 sccm; and
   a titanium target to substrate spacing of from about 125 to about 140 mm.

22. The method of claim 20, wherein the aluminum containing conductor layer has a thickness from about 3000 to 9000 Å, and is formed employing a bias sputtering method.

23. The method of claim 20 wherein by employing the ionized metal plasma bias sputtering method for forming the titanium layer the aluminum containing conductor layer is formed with an enhanced (111) crystallographic orientation.

24. The method of claim 20 wherein the substrate is employed within a microelectronics fabrication selected from the group consisting of semiconductor integrated circuit microelectronics fabrications, solar cell microelectronics fabrications, ceramic substrate microelectronics fabrications and flat panel display microelectronics fabrications.

25. The method of claim 20 wherein there is not employed a thermal annealing of the titanium layer after forming the titanium layer and prior to forming the aluminum containing conductor layer upon the titanium layer.

26. The method of claim 20 wherein the titanium layer is formed to a thickness of at least about 80 to about 200 angstroms.

27. A method for forming an aluminum containing conductor layer comprising:
   providing a substrate;
   forming over the substrate a titanium layer employing an ionized metal plasma bias sputtering method;
   forming upon the titanium layer a titanium nitride layer formed by a PVD sputtering method employing:
      a reactor chamber pressure of from about 2 to about 10 mTorr;
      a bias sputtering power of from about 2000 to about 10000 watts without any plasma activation;
      a substrate temperature of from about 20 to about 200 degrees centigrade;
      an argon sputtering gas flow rate of from about 20 to about 80 sccm; and
      a titanium nitride target to substrate spacing of from about 40 to about 60 mm; and
   forming upon the titanium nitride layer an aluminum containing conductor layer.

28. A method for forming an aluminum containing conductor layer comprising:
   providing a substrate;
   forming over the substrate a titanium layer employing an ionized metal plasma bias sputtering method;
   forming upon the titanium layer a titanium nitride layer;
   forming upon the titanium nitride layer an aluminum containing conductor layer the aluminum containing conductor layer being formed by a bias sputtering method employing:
      a reactor chamber pressure of from about 3 to about 8 mTorr;
      a bias sputtering power of from about 4000 to about 12000 watts without any plasma activation;
      a substrate temperature of from about 200 to about 400 degrees centigrade;
      an argon sputtering gas flow rate of from about 40 to about 100 sccm; and
      an aluminum-containing target to substrate spacing of from about 40 to about 60 mm.

* * * * *